US012671410B2

(12) United States Patent
Chen et al.

(10) Patent No.: US 12,671,410 B2
(45) Date of Patent: Jun. 30, 2026

(54) MILLER CLAMPING CIRCUIT FOR DRIVING WIDE BANDGAP HIGH VOLTAGE POWER DEVICE

(71) Applicant: The Hong Kong University of Science and Technology, Hong Kong (CN)

(72) Inventors: Jing Chen, Hong Kong (CN); Ji Shu, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 118 days.

(21) Appl. No.: 18/607,591

(22) Filed: Mar. 18, 2024

(65) Prior Publication Data

US 2025/0119136 A1 Apr. 10, 2025

Related U.S. Application Data

(60) Provisional application No. 63/589,026, filed on Oct. 10, 2023.

(51) Int. Cl.
*H03K 17/30* (2006.01)
*H03K 17/687* (2006.01)

(52) U.S. Cl.
CPC ....... *H03K 17/302* (2013.01); *H03K 17/6871* (2013.01); *H03K 2217/0063* (2013.01)

(58) Field of Classification Search
CPC ............. H03K 17/302; H03K 17/6871; H03K 2217/0063; H03K 17/163
See application file for complete search history.

(56) References Cited

U.S. PATENT DOCUMENTS

| | | | |
|---|---|---|---|
| 9,935,625 B2 | 4/2018 | Yamaguchi | |
| 10,979,032 B1 | 4/2021 | Leong et al. | |
| 12,107,416 B2 * | 10/2024 | Mizan ................... | H02H 9/046 |
| 2019/0393693 A1 | 12/2019 | Shibib et al. | |

(Continued)

OTHER PUBLICATIONS

Lei Zhang et al., "Performance Evaluation of High-Power SiC MOSFET Modules in Comparison to Si IGBT Modules," IEEE Transactions on Power Electronics, 2019, vol. 34 (2), p. 1181-1196.

(Continued)

*Primary Examiner* — Metasebia T Retebo
(74) *Attorney, Agent, or Firm* — IDEA Intellectual Limited; Sam T. Yip

(57) ABSTRACT

A Miller clamping circuit for driving a wide bandgap (WBG) device is provided. The Miller clamping circuit comprises: a semiconductor switching device having high side terminal connected to gate of the WBG device; and low side terminal connected to source of the WBG device; a first diode having anode connected to ground terminal of a driver IC chip; and cathode connected to control terminal of the switching device; a first resistor connected in parallel with the first diode; a second resistor having a first end connected to the ground of the driver IC chip; a second diode having anode connected to the low side terminal of the switching device and cathode connected to a second end of the second resistor; and a third resistor connected in parallel with the second diode. The Miller clamping circuit is configured to suppress a false turn-on and gate-loop oscillation of the WBG device simultaneously.

16 Claims, 9 Drawing Sheets

100

101

102

WBG device

T2

(56) References Cited

U.S. PATENT DOCUMENTS

2020/0161466 A1    5/2020   Yen et al.

OTHER PUBLICATIONS

Tiefu Zhao et al., "Comparisons of SiC MOSFET and Si IGBT Based Motor Drive Systems," 2007 IEEE Industry Applications Annual Meeting, 2007, p. 331-335.

Xuan Li et al., "Switching Loss Model of SiC MOSFET Promoting High Frequency Applications," Proceedings of the 31st International Symposium on Power Semiconductor Devices & ICs, 2019, p. 231-234.

Alex Lidow et al., "GaN Transistors for Efficient Power Conversion," Wiley, 2020, Third Edition, p. 1-36.

Jian Chen et al., "A Review of Switching Oscillations of Wide Bandgap Semiconductor Devices," IEEE Transactions on Power Electronics, 2020, vol. 35 (12), p. 13182-13199.

Tianjiao Liu et al., "A Survey on Switching Oscillations in Power Converters," IEEE Journal of Emerging and Selected Topics in Power Electronics, 2020, vol. 8 (1), p. 893-908.

Wei Jia Zhang et al., "A Smart Gate Driver IC for GaN Power HEMTs with Dynamic Ringing Suppression," IEEE Transactions on Power Electronics, 2021, vol. 36 (12), p. 14119-14132.

Yujie Ding et al., "A Review of the Crosstalk Suppression Methods for SiC MOSFETs in the Phase-leg Circuit Configuration," 2021 IEEE Workshop on Wide Bandgap Power Devices and Applications in Asia, 2021, p. 206-212.

Yu Chen et al., "Gate-drive Power Supply with Decayed Negative Voltage to Solve Crosstalk Problem of GaN Synchronous Buck Converter," IEEE Transactions on Power Electronics, 2021, vol. 36 (1), p. 6-11.

"SiC Power Devices and Modules Application Note Rev.003," ROHM Semiconductor—ROHM Co., Ltd., 2020, p. 1-88.

"Guidelines for CoolSiCTM MOSFET gate drive voltage window," Infineon, 2023, AN2018-09, Revision 1.4, p. 1-20.

Daniel Martin et al., "Performance Analysis of a SiC MOSFET Half Bridge Power Module with a Miller Clamp," 2017 IEEE International Workshop on Integrated Power Packaging, 2017, p. 1-5.

Panbao Wang et al., "An Improved Active Crosstalk Suppression Method for High-Speed SiC MOSFETs," IEEE Transactions on Industry Applications, 2019, vol. 55 (6), p. 7736-7744.

Chunhui Liu et al., "Smart Self-driving Multi-level Gate Driver for Fast Switching and Crosstalk Suppression of SiC MOSFETs," IEEE Journal of Emerging and Selected Topics in Power Electronics, 2020, vol. 8 (1), p. 442-453.

Anselmo Gianluca Liberti et al., "Suppressing voltage glitches in SiC MOSFETs," PCIM Europe 2019; International Exhibition and Conference for Power Electronics, Intelligent Motion, Renewable Energy and Energy Management, 2019, VDE, p. 1423-p. 1429.

"Onsemi M 1 1200 V SiC MOSFETs & Modules: Characteristics and Driving Recommendations," onsemi, 2022, AND90103/D, Rev. 3, p. 1-26.

Zheyu Zhang et al., "Intelligent Gate Drive for Fast Switching and Cross-Talk Suppression of SiC Devices," IEEE Transactions on Power Electronics, 2017, vol. 32 (12), p. 9319-9332.

Ho-Tin Tang et al., "Passive Resonant Level Shifter for Suppression of Crosstalk Effect and Reduction of Body Diode Loss of SiC MOSFETs in Bridge Legs," IEEE Transactions on Power Electronics, 2020, vol. 35 (7), p. 7204-7225.

Ho-Tin Tang et al., "Adaptive Level-Shift Gate Driver With Indirect Gate Oxide Health Monitoring for Suppressing Crosstalk of SiC MOSFETs," IEEE Transactions on Power Electronics, 2023, vol. 38 (8), p. 10196-10212.

Mustafa Tahir et al., "Performance Improvement Strategies for Discrete Wide Bandgap Devices: A Systematic Review," frontiers in Energy Research, 2021, vol. 9 (788689), p. 1-22.

Chengmin Li et al., "High Off-State Impedance Gate Driver of SiC MOSFETs for Crosstalk Voltage Elimination Considering Common-Source Inductance," IEEE Transactions on Power Electronics, 2020, vol. 35 (3), p. 2999-3011.

Zheyu Zhang et al., "Active Gate Driver for Crosstalk Suppression of SiC Devices in a Phase-Leg Configuration," IEEE Transactions on Power Electronics, 2014, vol. 29 (4), p. 1986-1997.

Ziyue Dang et al., "A New GaN Hybrid Resonant-Clamping Gate driver For High Frequency SiC MOSFETs," EPE'20 ECCE Europe, 2020, p. 1-6.

Ji Shu et al., "Protection of SiC MOSFET from Negative Gate Voltage Spikes with a Low-Voltage GaN HEMT," 2023 35th International Symposium on Power Semiconductor Devices and ICs, 2023, p. 1-4.

Ji Shu et al., "A Gate Driver with a Low-Voltage GaN HEMT for False Turn-on Suppression and Gate Reliability Enhancement of SiC MOSFETs," 2024 IEEE Applied Power Electronics Conference and Exposition, 2024, p. 1-5.

* cited by examiner

MILLER CLAMPING CIRCUIT FOR DRIVING WIDE BANDGAP HIGH VOLTAGE POWER DEVICE

COPYRIGHT NOTICE

CROSS-REFERENCE TO RELATED APPLICATIONS

The present application claims priority from the U.S. Provisional Patent Application No. 63/589,026 filed Oct. 10, 2023. The disclosure of which is incorporated herein by reference in its entirety.

FIELD OF THE INVENTION

The present invention generally relates to voltage clamping technology. More specifically the present invention relates to a Miller clamping circuit for suppressing a false turn-on and gate-loop oscillation of the wide bandgap high voltage power device simultaneously.

BACKGROUND OF THE INVENTION

Wide bandgap (WBG) power devices, such as Silicon Carbide (SiC) power metal-oxide-semiconductor field-effect transistors (MOSFETs) and gallium nitride (GaN) high-electron-mobility transistors (GaN HEMTs), can be operated at higher frequencies and higher temperatures than the traditional Si-based power devices of similar voltage and current ratings, thereby becoming the devices of choice in many high-efficiency and high-power-density converters. To operate the WBG power devices at high speeds appropriately, however, the parasitic inductances, especially those in the gate loop, need to be carefully managed.

First, the parasitic inductance impedes the gate current during the switching transient, thereby slowing down the switching speed and increasing the switching loss. Second, the parasitic inductance in series with the gate capacitance may induce gate-loop oscillation, which could lead to false turn-on during the switching process in view of the relatively low threshold voltages of some commercial WBG power devices. Third, the parasitic inductance could also lead to considerable positive and negative gate voltage spikes on the OFF-state device when adjacent devices are switching (also known as crosstalk). The positive spikes could also lead to false turn-on, whereas the negative spikes could overstress the gate as the minimum allowed gate voltages of mainstream WBG power devices (especially SiC MOSFETs) are limited, usually in the range of −3 to −10 V.

One solution to suppress the false turn-on is to use a gate driver with a Miller-clamping function to suppress the crosstalk-induced gate spikes. However, Miller clamp cannot address the other two issues caused by the parasitic inductance, i.e., the reduced switching speed and oscillation-induced false turn-on. In addition, the performance of Miller clamp could be compromised by the parasitic inductance during the fast switching transient of WBG power devices.

Another solution is to use a negative OFF-state gate voltage to turn off the device. The negative OFF-state gate voltage creates a wider margin below threshold voltage to accommodate the gate voltage spikes/ringing induced by crosstalk and oscillation, so that the false turn-on can be suppressed. However, the negative gate bias could adversely increase the reverse-conduction loss in SiC MOSFETs and GaN HEMTs. Most importantly, the negative OFF-state gate voltage could lead the gate bias getting into the unsafe range from the reliability angle, especially when the negative gate spike occurs. The negative gate overstress and increased reverse-conduction loss can be mitigated by using a two-phase turn-off scheme by firstly turning OFF the WBG HV power device with a negative OFF-state gate voltage, and then actively shifting the negative OFF-state gate voltage back to zero before the negative spikes occur. However, the complexity of the driver circuit is compromised. Some approaches use a level shifting method with passive components, but has an adverse impact on the ON-state conduction loss due to reduced ON-state gate voltage.

SUMMARY OF THE INVENTION

It is one objective of the present invention to provide a clamping circuit, which can work with a single-polarity gate driver with a gate turn-off voltage of 0 V. The clamping circuit aims to achieve miller clamping and negative gate voltage spike clamping for a WBG HV power device, thereby suppressing the false turn-on and protecting the gate of the WBG HV power device from overstress simultaneously.

In accordance with a first aspect of the present invention, a Miller clamping circuit for driving a wide bandgap high voltage power device is provided. The wide bandgap device may be a SiC MOSFET or a GaN HEMT having a gate, a drain and a source. The Miller clamping circuit comprises: a semiconductor switching device having a high side terminal connected to a gate of the wide bandgap device; and a low side terminal connected to a source of the wide bandgap device; a first diode having an anode connected to a ground terminal of a driver IC chip; and a cathode connected to a control terminal of the semiconductor switching device; a first resistor connected in parallel with the first diode; a second resistor having a first end connected to the ground of the driver IC chip; a second diode having an anode connected to the low side terminal of the semiconductor switching device and a cathode connected to a second end of the second resistor; and a third resistor connected in parallel with the second diode. The Miller clamping circuit is configured to suppress a false turn-on and gate-loop oscillation of the wide bandgap power device simultaneously.

According to a second aspect of the present invention, a Miller clamp driver circuit for driving a wide bandgap device. The Miller clamp driver circuit comprises: a driver IC chip having at least a driving terminal, a power supply terminal and a ground terminal; and the Miller clamping circuit according to the first aspect of the present invention.

In one embodiment of the present invention, the semiconductor switching device is a high-electron-mobility-transistor (HEMT) having a drain being the high side terminal of the semiconductor switching device; a source being the low side terminal of the semiconductor switching device; and a gate being the control terminal of the semiconductor switching device.

In one embodiment of the present invention, the HEMT is a gallium nitride (GaN) HEMT.

In one embodiment of the present invention, the GaN HEMT is low voltage GaN HEMT has a blocking voltage higher than the on-state gate voltage of the wide bandgap device to be driven. And the GaN HEMT has a threshold voltage lower than a threshold voltage of the wide bandgap device to be driven.

In one embodiment of the present invention, the GaN HEMT is enhancement-mode (E-mode) GaN HEMT.

In one embodiment of the present invention, the first resistor has a resistance value in a range of $0.1\Omega$-$10000\Omega$.

In one embodiment of the present invention, the second resistor has a resistance value in a range of $0.1\Omega$-$10000\Omega$.

In one embodiment of the present invention, the third resistor has a resistance value in a range of $0.1\Omega$-$10000\Omega$.

The provided Miller claim driver circuit uses an LV GaN HEMT to realize two functions-negative gate voltage spike clamping and Miller clamping. Thanks to the fast switching speed of the LV GaN HEMT, the gate voltage of the HV power device can be well clamped within both positive and negative safe thresholds. A gate turn-off voltage $V_{GS\text{-}off}$ of 0V can be used to turn off the HV power device with suppressed false turn-on and effective protection against negative gate overstress simultaneously. Such a single-polarity driving scheme is not only simpler but also reduces the reverse-conduction loss of the HV power device. In addition, the gate-loop oscillation and the resultant false turn-on can also be suppressed as part of the gate-loop parasitic inductance can be bypassed by the LV GaN HEMT, leading to a faster switching speed with further reduced switching loss.

BRIEF DESCRIPTION OF THE DRAWINGS

Embodiments of the invention are described in more details hereinafter with reference to the drawings, in which.

DETAILED DESCRIPTION

In the following description, details of the present invention are set forth as preferred embodiments. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1:
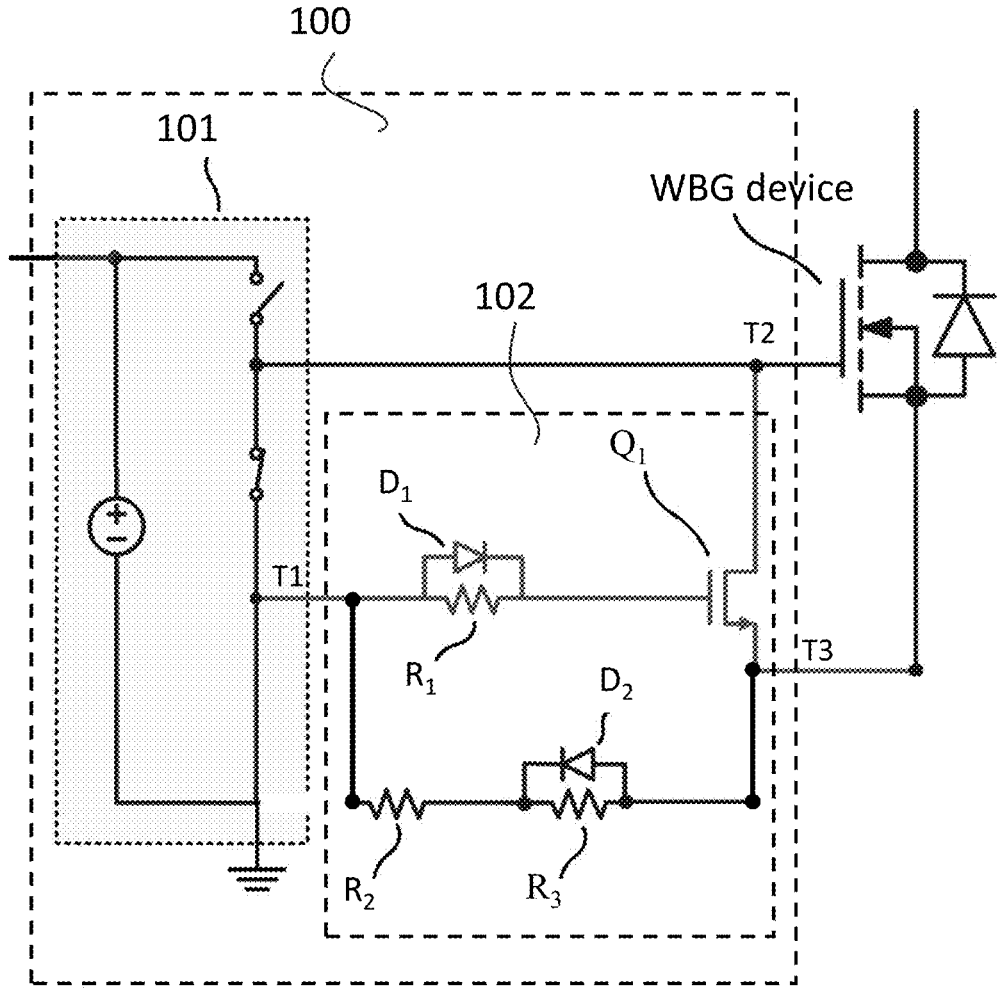
FIG. 1 shows a circuit diagram of a Miller clamp driver circuit 100 for driving a WBG high voltage (HV) power device in accordance with one embodiment of the present invention.

FIG. 1 shows a circuit diagram of a Miller clamp driver circuit 100 for driving a WBG high voltage (HV) power device in accordance with one embodiment of the present invention. The WBG HV power device can be a SiC MOSFET or a GaN HEMT. As shown, the Miller clamp driver circuit 100 comprises a driver IC chip 101 and a Miller clamping circuit 102.

The driver IC chip 101 has at least a driving terminal, a power supply terminal and a ground terminal. The driver IC chip is a simple single-polarity gate driver and configured to generate a 0-V $V_{GS\text{-}off}$ at the driving terminal when it is controlled/commanded to turn off the WBG HV power device.

The Miller clamping circuit 102 has a first terminal T1 connected to the ground terminal of the driver IC chip 101; a second terminal T2 connected to the gate of the WBG device; and a third terminal T3 connected to the source of the WBG device.

The Miller clamping circuit 102 is configured to suppress a false turn-on and gate-loop oscillation of the WBG device simultaneously.

In one embodiment, the Miller clamping circuit 102 includes a semiconductor switching device $Q_1$ having a high side terminal connected to the second terminal T2 (i.e., the gate of the WBG device); and a low side terminal connected to the third terminal T3 (i.e. the source of the WBG device); a first diode $D_1$ having an anode connected to the first terminal T1 (i.e., the ground terminal of the driver IC 101) and a cathode connected to a control terminal of the semiconductor switching device $Q_1$; and a first resistor $R_1$ connected in parallel with the first diode $D_1$.

The Miller clamping circuit 102 further comprises a second resistor $R_2$ having a first end connected to the anode of the first diode (i.e., the first terminal T1), a second diode $D_2$ having an anode connected to the low side terminal of the semiconductor switching device $Q_1$ (i.e., the third terminal T3); a third resistor $R_3$ connected in parallel with the second diode $D_2$.

Preferably, the first resistor $R_1$ has a resistance value in a range of $0.1\Omega$-$10000\Omega$; the second resistor $R_2$ has a resistance value in a range of $0.1\Omega$-$10000\Omega$; and the third resistor $R_3$ has a resistance value in a range of $0.1\Omega$-$10000\Omega$.

Preferably, the semiconductor switching device $Q_1$ is a low voltage (LV) high-electron-mobility-transistor (HEMT) having a drain being the high side terminal of the semiconductor switching device; a source being the low side terminal of the semiconductor switching device; and a gate being the control terminal of the semiconductor switching device.

Preferably, the HEMT $Q_1$ is an enhancement-mode (E-mode) gallium nitride (GaN) HEMT having a rated voltage higher than the on-state gate voltage of the WBG device to be driven, e.g., 20 V and a rated current higher than the maximum current may occur in the driver circuit, e.g., 2A.

FIGS. 2A to 2D show the operation mechanism of the Miller clamp driver circuit. In the following detailed description of the embodiment, the HV SiC MOSFET is taken as an example of the HV power device to be driven, although the Miller clamp driver circuit can also be applied to HV GaN HEMTs.

Figure 2A:
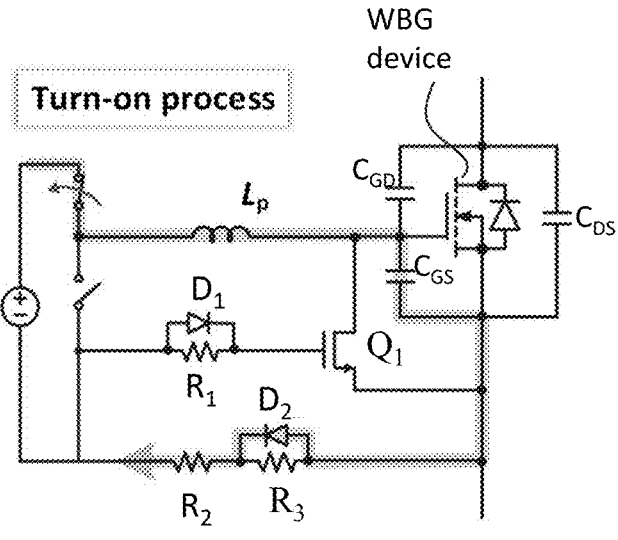
FIGS. 2A to 2D show the operation mechanism of the Miller clamp driver circuit in accordance with one embodiment of the present invention.

As shown in FIG. 2A, during the turn-on process, the LV GaN HEMT $Q_1$ is stable in OFF state, while the driver IC sources current to charge up the gate-source capacitor of the SiC MOSFET, thereby turning ON the HV power device. The turn-on speed can be tuned by the gate resistor $R_2$.

Figure 2B:
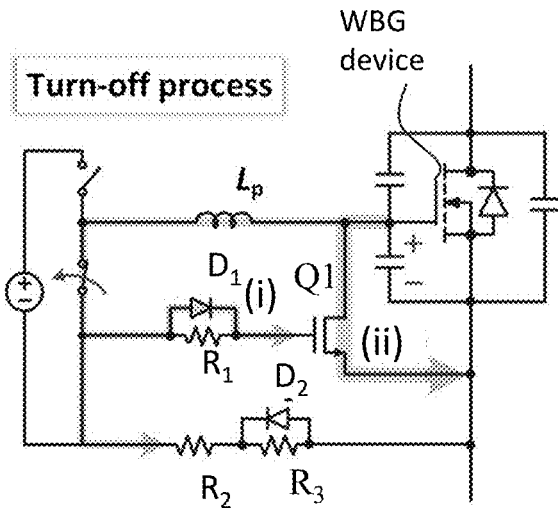

As show in FIG. 2B, during the turn-off process, a gate-loop current can be diverted into the gate-source capacitor of the LV GaN HEMT $Q_1$ through the electrical path (i). As a result, the HEMT $Q_1$ can be turned ON to provide an additional discharging path (ii) for the SiC MOSFET's gate charge, thereby accelerating the turn-off process. Meanwhile, the gate-loop oscillation can also be suppressed, as parasitic inductance $L_p$ in the driver circuit is bypassed through the discharging path (ii) provided by the HEMT $Q_1$.

Figure 2C:
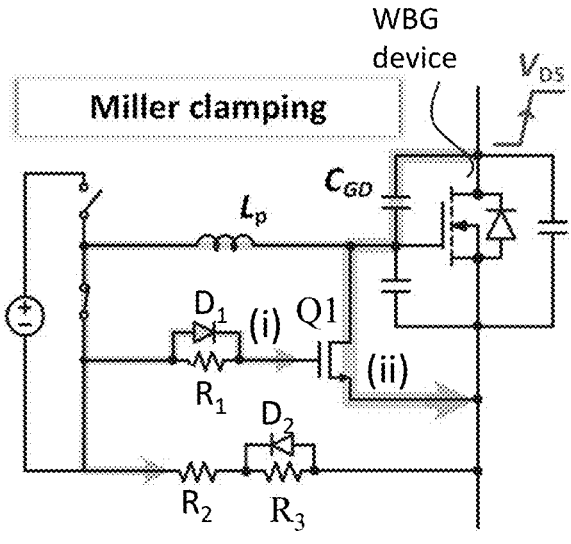

As shown in FIG. 2C, the Miller-effect-induced positive gate voltage spike also experiences a similar clamping process. Compared with the HV SiC MOSFET to be driven, the lateral LV GaN HEMT $Q_1$ with a much smaller gate-source capacitor that can switch much faster. Therefore, before the HV SiC MOSFET experiences false turn-on, the LV GaN HEMT $Q_1$ can be turned ON to provide the electrical path (ii) to clamp the positive gate spikes of HV power device and effectively suppress the crosstalk-induced false turn-on.

Figure 2D:
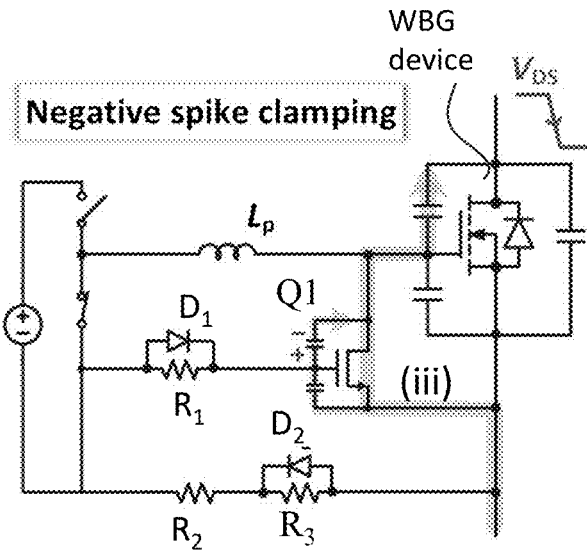

As shown in FIG. 2D, the Miller claim driver circuit also provides gate protection for the HV power device by suppressing the negative gate voltage spikes. The reverse conduction of the LV GaN HEMT $Q_1$ clamps the magnitude of the negative gate voltage spikes through the electrical path (iii), providing protection for the gate of the HV power device against the negative gate overstress.

Figure 3:
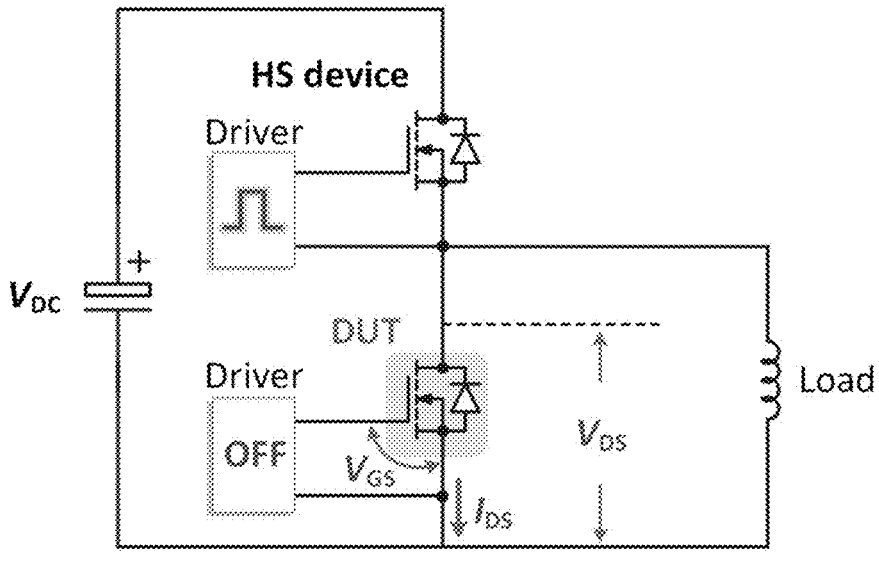
FIG. 3 shows the half-bridge circuit used to verify the Miller clamping and negative spike clamping performance of the Miller clamp driver circuit disclosed in the present application.

FIG. 3 shows the half-bridge circuit used to verify the Miller clamping and negative spike clamping performance of the Miller clamp driver circuit disclosed in the present application. The half-bridge circuit features two identical HV SiC MOSFETs, both driven by the driver circuit. Due to the crosstalk between the high-side (HS) device and the low-side (LS) device under test (DUT), the turn-on process of the HS device induces a positive gate voltage spike on the LS DUT, which may induce false turn-on. The turn-off process of the HS device induces a negative gate voltage spike on the LS DUT, which may overstress the gate of the DUT.

Figures 4A, 4B, 4C:
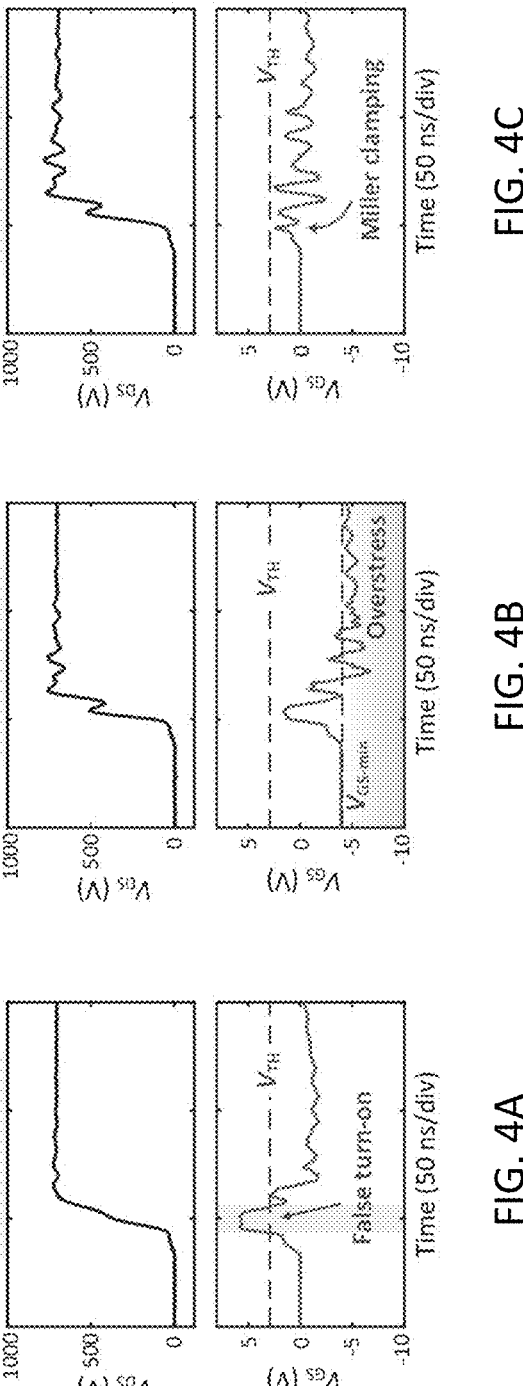
FIGS. 4A to 4C show the positive gate-source voltage ($V_{GS}$) spikes of the device under test (DUT) with conventional single-polarity driver (i.e., gate turn-off voltage $V_{GS\text{-}off}$=0V), dual-polarity driver with gate turn-off voltage $V_{GS\text{-}off}$=−4 V, and the Miller clamp driver circuit disclosed in the present application, respectively.

FIGS. 4A to 4C show the positive gate-source voltage ($V_{GS}$) spikes of the LS DUT with conventional single-polarity driver (i.e., $V_{GS-off}=0$ V), dual-polarity driver with $V_{GS-off}=-4$ V, and the Miller clamp driver circuit disclosed in the present application, respectively. As shown in FIG. 4A, with the conventional single-polarity driver, the positive gate-source voltage spike exceeds MOSFET's $V_{TH}$, resulting in false turn-on. As shown in FIG. 4B, the dual-polarity driver with $-4$-V $V_{GS-off}$ creates a wider margin below $V_{TH}$ to accommodate the positive spike. However, the gate voltage oscillation exceeds $V_{GS-min}$, leading to undesired gate overstress. In comparison, as shown in FIG. 4C, with the Miller clamp driver circuit, the positive gate-source voltage spike is well clamped below SiC MOSFET's $V_{TH}$, suppressing false turn-on effectively without requiring a negative $V_{GS-off}$.

Figures 5A, 5B, 5C:
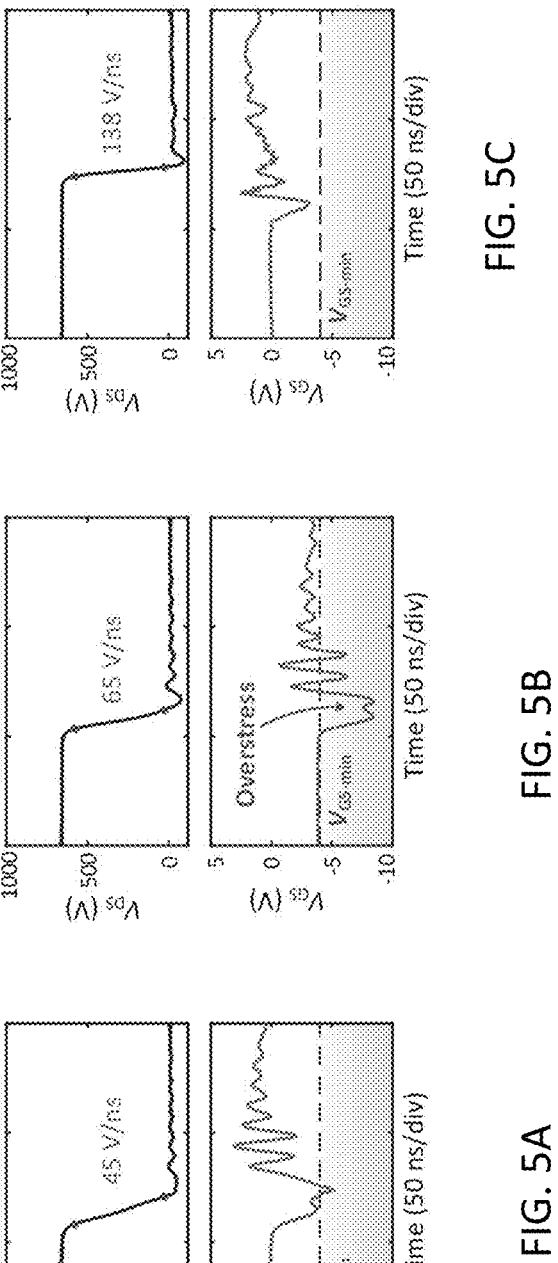
FIGS. 5A to 5C show the crosstalk-induced negative gate-source voltage spikes of the DUT with a conventional single-polarity driver (i.e., gate turn-off voltage $V_{GS\text{-}off}$=0 V), dual-polarity driver with gate turn-off voltage $V_{GS\text{-}off}$=−4 V, and the Miller clamp driver circuit disclosed in the present application, respectively.

FIGS. 5A to 5C show the crosstalk-induced negative gate-source voltage spikes of the LS DUT with a conventional single-polarity driver (i.e., $V_{GS-off}=0$ V), dual-polarity driver with $V_{GS-off}=-4$ V, and the Miller clamp driver circuit disclosed in the present application, respectively. As shown in FIG. 5A, with the conventional single-polarity driver, the SiC MOSFET's gate is overstressed slightly even at a moderate $V_{DS}$ slew rate for SiC MOSFETs (i.e., 45 V/ns). As shown in FIG. 5B, the dual-polarity driver with $-4$-V $V_{GS-off}$ exhausts the margin to accommodate the negative gate voltage spikes, resulting in severe gate overstress when the negative spike occurs. As shown in FIG. 5C, in comparison, the proposed driver with 0 V $V_{GS}$-off preserves the negative gate voltage margin, while the reverse conduction of the LV GaN HEMT helps suppress the negative gate spikes. As a result, the SiC MOSFET's gate is effectively protected from the negative gate overstress.

Figure 6:
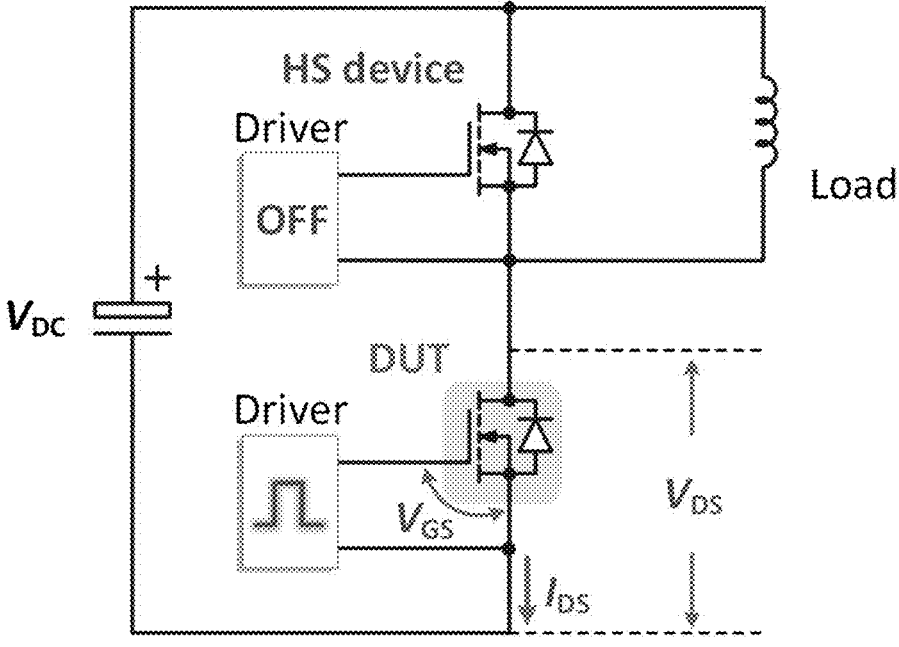
FIG. 6 shows the half-bridge test circuit used to characterize the switching process and switching loss of the DUT with different gate driver circuits

FIG. 6 shows the half-bridge test circuit used to characterize the switching process and switching loss of the LS DUT with different gate driver circuits.

Figures 7A, 7B, 7C:
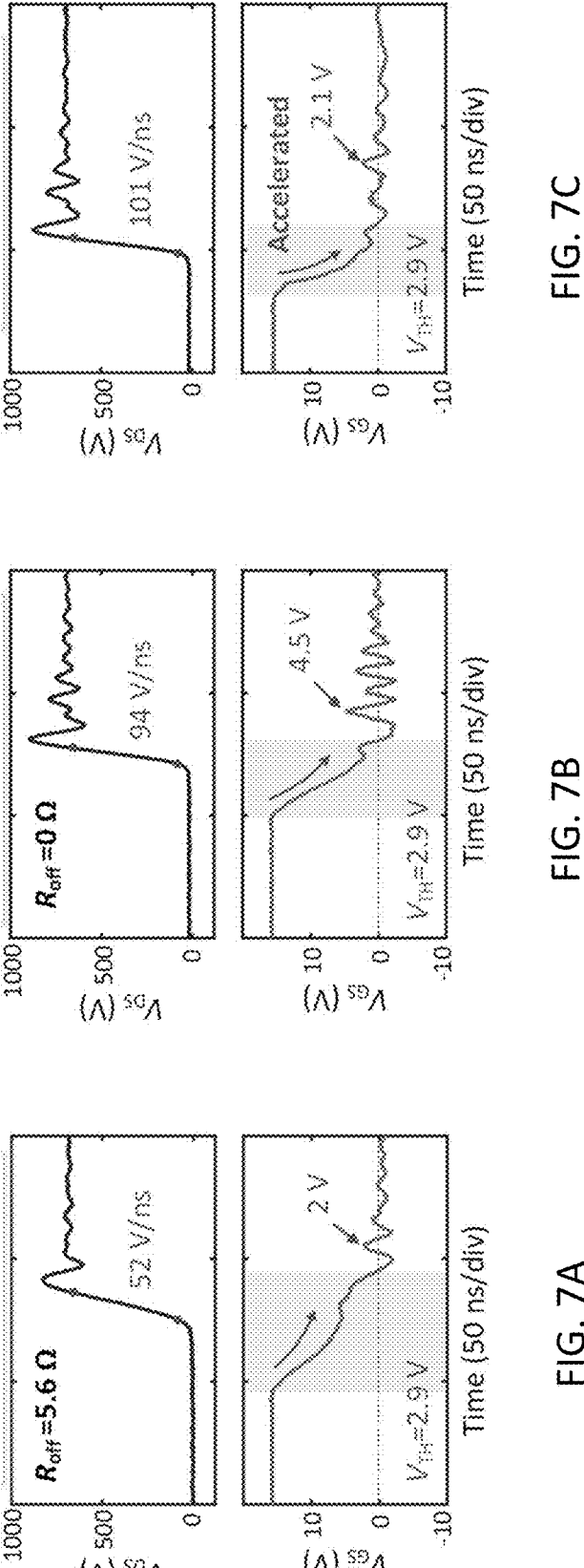
FIGS. 7A and 7B show waveforms of the DUT during turn-off processes with the conventional single-polarity driver with two different gate resistance values, respectively.
FIG. 7C shows waveforms of the DUT during turn-off process with the Miller clamp driver circuit disclosed in the present application.

FIGS. 7A and 7B show waveforms of the LS DUT during turn-off processes with the conventional single-polarity driver with two different gate resistance values (i.e., $R_3$), respectively. As shown, decreasing the gate resistance of the conventional single-polarity gate driver can accelerate the $C_{GS}$ discharging process. However, the gate-loop oscillation is exacerbated, leading to false turn-on and thus compromising the reduction of switching loss.

FIG. 7C shows waveforms of the LS DUT during turn-off process with the Miller clamp driver circuit disclosed in the present application. As shown, the large current sink capability of the LV GaN HEMT helps accelerate the discharging process of MOSFET's $C_{GS}$. Meanwhile, part of the parasitic inductance is bypassed by the LV GaN HEMT, thereby the gate-loop oscillation and the resultant false turn-on can also be suppressed.

Figure 8B:
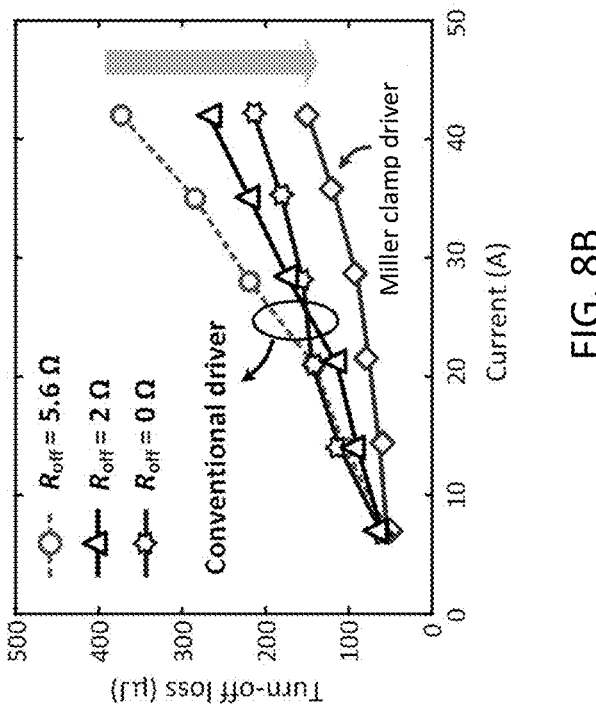
FIGS. 8A and 8B show the turn-on losses and turn-off losses of the LS DUT with different gate drivers, respectively.
Figure 8A:
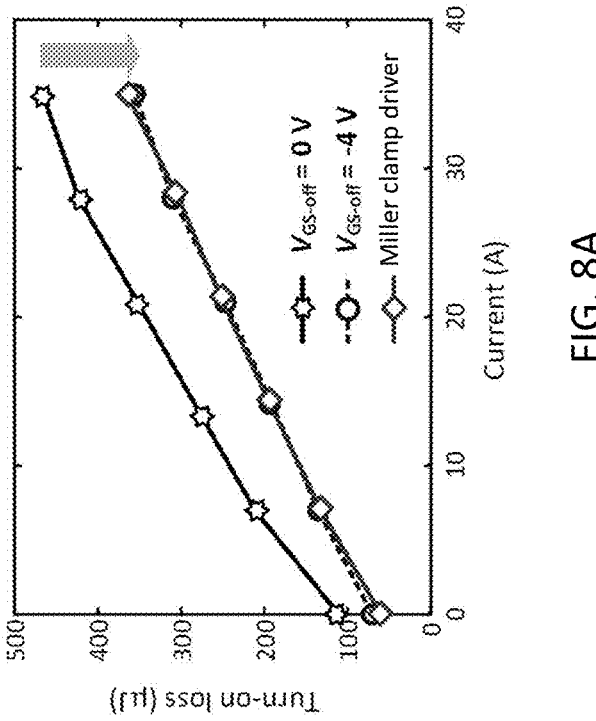

FIGS. 8A and 8B show the turn-on losses and turn-off losses of the LS DUT with different gate drivers, respectively.

As shown in FIG. 8A, compared with the conventional single-polarity driver, the dual-polarity driver with $-4$-V $V_{GS-off}$ can suppress the false turn-on, and therefore eliminate the associated additional switching loss. However, the dual-polarity driver adversely increases the reverse-conduction loss in the circuit and overstresses the SiC MOSFET's gate. The provided driver exhibits the similar turn-on loss as the dual-polarity driver at all current levels, indicating the false turn-on is also successfully suppressed, thanks to the effective Miller-clamping function provided by the LV GaN HEMT.

As shown in FIG. 8B, the turn-off losses of the SiC MOSFET with the conventional single-polarity driver and the provided driver are compared. With the conventional single-polarity driver, reducing the gate resistance (i.e., $R_3$) from 5.6Ω to 2Ω leads to a faster turn-off process with lower switching loss. However, further reducing the gate resistance adversely increases the switching loss at moderate current levels, as the gate-loop oscillation is exacerbated, leading to false turn-on and the associated additional switching loss. With the provided driver, the turn-off loss is significantly lower, which is a direct benefit of the accelerated turn-off process and suppressed gate-loop oscillation.

While the present disclosure has been described and illustrated with reference to specific embodiments thereof, these descriptions and illustrations are not limiting. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. Modifications may be made to adapt a particular situation, material, composition of matter, method, or process to the objective and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A Miller clamping circuit for driving a wide bandgap high voltage power device, comprising:
    a semiconductor switching device having a high side terminal connected to a gate of the wide bandgap high voltage power device; and a low side terminal connected to a source of the wide bandgap high voltage power device;
    a first diode having an anode connected to a ground terminal of a driver IC chip; and a cathode connected to a control terminal of the semiconductor switching device;
    a first resistor connected in parallel with the first diode;
    a second resistor having a first end connected to the ground of the driver IC chip;
    a second diode having an anode connected to the low side terminal of the semiconductor switching device and a cathode connected to a second end of the second resistor; and
    a third resistor connected in parallel with the second diode; and
    wherein the Miller clamping circuit is configured to suppress a false turn-on and gate-loop oscillation of the wide bandgap high voltage power device simultaneously with a gate turn-off voltage of 0 V.

2. The Miller clamping circuit according to claim 1, wherein the semiconductor switching device is a high-electron-mobility-transistor (HEMT) having a drain being the high side terminal of the semiconductor switching device; a source being the low side terminal of the semiconductor switching device; and a gate being the control terminal of the semiconductor switching device.

3. The Miller clamping circuit according to claim 2, wherein the HEMT is a gallium nitride (GaN) HEMT.

4. The Miller clamping circuit according to claim 3, wherein the GaN HEMT is low voltage GaN HEMT having a blocking voltage higher than an on-state gate voltage of the wide bandgap high voltage power device; and the low voltage GaN HEMT has a threshold voltage lower than a threshold voltage of the wide bandgap high voltage power device.

5. The Miller clamping circuit according to claim 4, wherein the GaN HEMT is enhancement-mode (E-mode) GaN HEMT.

6. The Miller clamping circuit according to claim 1, wherein the first resistor has a resistance value in a range of 0.1Ω-10000 Ω.

7. The Miller clamping circuit according to claim 1, wherein the second resistor has a resistance value in a range of 0.1Ω-10000 Ω.

8. The Miller clamping circuit according to claim 1, wherein the third resistor has a resistance value in a range of 0.1Ω-10000 Ω.

9. A Miller clamp driver circuit for driving a wide bandgap high voltage power device, comprising:
    a driver IC chip having at least a driving terminal, a power supply terminal and a ground terminal; and
    the Miller clamping circuit of claim 1.

10. The Miller clamp driver circuit according to claim 9, wherein the semiconductor switching device is a high-electron-mobility-transistor (HEMT) having a drain being the high side terminal of the semiconductor switching device; a source being the low side terminal of the semiconductor switching device; and a gate being the control terminal of the semiconductor switching device.

11. The Miller clamp driver circuit according to claim 10, wherein the HEMT is a gallium nitride (GaN) HEMT.

12. The Miller clamp driver circuit according to claim 11, wherein the GaN HEMT is low voltage GaN HEMT has a blocking voltage higher than an on-state gate voltage of the wide bandgap high voltage power device; and the low voltage GaN HEMT has a threshold voltage lower than a threshold voltage of the wide bandgap high voltage power device.

13. The Miller clamp driver circuit according to claim 12, wherein the LV GaN HEMT is enhancement-mode (E-mode) GaN HEMT.

14. The Miller clamp driver circuit according to claim 9, wherein the first resistor has a resistance value in a range of 0.1Ω-10000 Ω.

15. The Miller clamp driver circuit according to claim 9, wherein the second resistor has a resistance value in a range of 0.1Ω-10000 Ω.

16. The Miller clamp driver circuit according to claim 9, wherein the third resistor has a resistance value in a range of 0.1Ω-10000 Ω.

* * * * *